US005084966A

United States Patent [19]

Murase

[11] Patent Number: 5,084,966

[45] Date of Patent: Feb. 4, 1992

[54] METHOD OF MANUFACTURING HEAT PIPE SEMICONDUCTOR COOLING APPARATUS

[75] Inventor: Takashi Murase, Yokohama, Japan

[73] Assignee: The Furukawa Electric Co., Ltd., Tokyo, Japan

[21] Appl. No.: 582,194

[22] PCT Filed: Feb. 6, 1990

[86] PCT No.: PCT/JP90/00145

§ 371 Date: Sep. 26, 1990

§ 102(e) Date: Sep. 26, 1990

[87] PCT Pub. No.: WO90/09036

PCT Pub. Date: Aug. 9, 1990

[30] Foreign Application Priority Data

Feb. 6, 1989 [JP] Japan ........................................ 1-27025

[51] Int. Cl.[5] ................................................ F28F 3/04

[52] U.S. Cl. ............................. 29/890.043; 29/850.54

[58] Field of Search .................... 29/890.035, 890.043, 29/890.054; 165/152, 153, 170, 175

[56] References Cited

U.S. PATENT DOCUMENTS 2,928,166 3/1960 Worn et al. ................ 29/890.043 X
3,993,126 11/1976 Taylor ........................ 29/890.043 X
4,675,783 6/1987 Murase et al. .
4,932,469 6/1990 Beatenbough ............. 29/890.035 X

FOREIGN PATENT DOCUMENTS 59-41858 3/1984 Japan .
59-71072 5/1984 Japan .
60-57956 4/1985 Japan .
61-138092 6/1986 Japan .

*Primary Examiner*—Timothy V. Eley
*Attorney, Agent, or Firm*—Frishauf, Holtz, Goodman & Woodward

[57] ABSTRACT

In a method of manufacturing a heat pipe semiconductor cooling apparatus of this invention, one or a plurality of through holes are formed in a metal elongated member, and the metal elongated member is cut into a predetermined length to obtain a desired metal block. End portions of the through holes of the metal block are sealed, these parts are bonded by heating to constitute a heat-absorbing portion, and one end portion of a heat pipe is inserted in each through hole. Alternatively, after one end portion of a heat pipe is inserted in each through hole, an end portion of the through hole is sealed, and these parts are bonded by heating to constitute a heat-absorbing portion. Fins are mounted on the other end portions of the heat pipes by press fitting to constitute a radiating portion.

21 Claims, 4 Drawing Sheets

METHOD OF MANUFACTURING HEAT PIPE SEMICONDUCTOR COOLING APPARATUS

TECHNICAL FIELD

The present invention relates to a method of manufacturing a heat pipe semiconductor cooling apparatus for cooling a power semiconductor such as a thyristor.

BACKGROUND ART

The present inventors have disclosed a cooling apparatus using a heat pipe as a semiconductor cooling apparatus for, e.g., a thyristor in Published Unexamined Japanese Patent Application No. 60-57956. As shown in FIGS. 7 and 8, (Prior Art) in this heat pipe semiconductor cooling apparatus, fins 2 consisting of a metal such as aluminum having high heat conductivity are fitted on heat pipes 1 consisting of a metal such as copper having high heat conductivity to form a radiating portion 3. Lower end portions of the heat pipes 1 are fitted in a metal block 4 consisting of, e.g., copper or aluminum. A semiconductor element such as a thyristor is mounted on the metal block 4. Heat generated by the semiconductor element is conducted to the heat pipes 1 and radiated from the fins 2 by natural or forcible cooling. As a result, the operation efficiency of the semiconductor element is improved.

In addition, an insulating heat pipe semiconductor cooling apparatus in which an insulating cylinder consisting of, e.g., aluminum is arranged in an intermediate portion of the heat pipe or a portion between the heat pipe and the metal block has been developed.

In the manufacture of these heat pipe semiconductor cooling apparatuses, boring processing is performed one or a plurality of times for the metal block 4 by using a drill or the like to form (non-through) holes 5 having a predetermined depth. Subsequently, a pre-treatment such as oxide film removal is performed for the holes 5. Thereafter, one end portion of the heat pipe 1 is inserted in the hole 5. A solder 6 or the like is filled in a gap between the heat pipe 1 and the hole 5 to integrally bond the heat pipe 1 and the metal block 4.

In such a conventional method, however, the boring processing is performed by an individual NC (numerically controlled) drill machine. Therefore, a long time period is required for the boring processing, and precision of the processing is poor. In addition, the boring processing increases manufacturing cost.

DISCLOSURE OF INVENTION

The present invention discloses a method of manufacturing a heat pipe semiconductor cooling apparatus, comprising the steps of:

forming one or a plurality of through holes in a metal elongated member;

cutting the metal elongated member into a predetermined length to obtain a metal block having a predetermined shape;

sealing one end portion of each of the through holes;

inserting a low-temperature solder and one end portion of a heat pipe in the sealed through hole and bonding the parts by heating, thereby constituting a heat-absorbing portion; and mounting fins on the other end portions of the heat pipes by press fitting to constitute a radiating portion.

There is also provided according to the present invention, a method of manufacturing a heat pipe semiconductor cooling apparatus, comprising the steps of:

forming one or a plurality of through holes in a metal elongated member;

cutting the metal elongated member into a predetermined length to obtain a metal block having a predetermined shape;

placing the metal block on a heat-resistant flat plate to seal cavities of the through holes, inserting a low-temperature solder and one end portion of a heat pipe in each through hole, and bonding the parts by heating, thereby constituting a heat-absorbing portion., and mounting fins on the other end portions of the heat pipes by press fitting to constitute a radiating portion.

BEST MODE OF CARRYING OUT THE INVENTION

An embodiment of the present invention will be described below with reference to the accompanying drawings.

Embodiment

Figure 1:
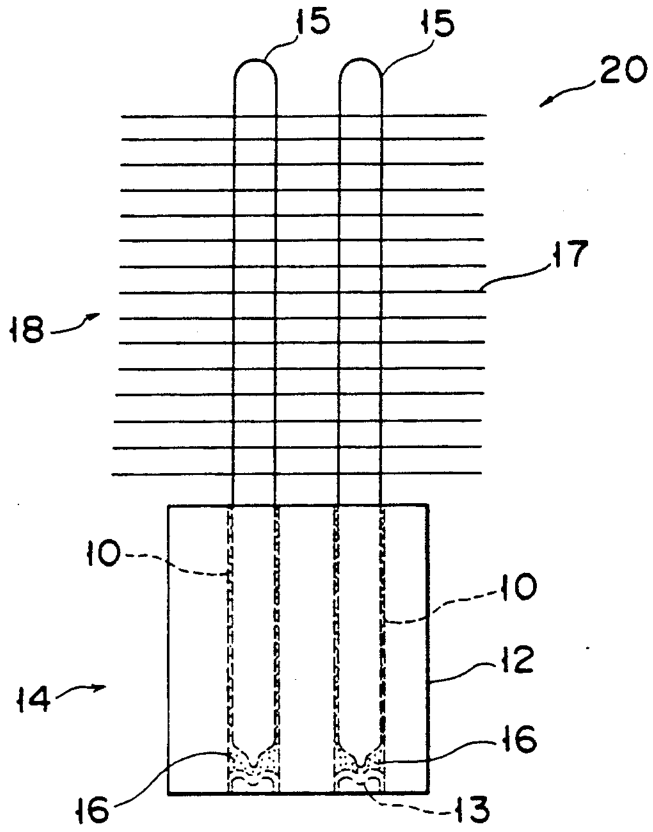
FIG. 1 is a front view showing a heat pipe semiconductor cooling apparatus manufactured in accordance with an embodiment of the present invention.
Figure 2:
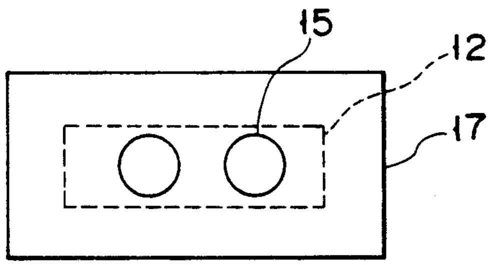
FIG. 2 is a plan view showing the heat pipe semiconductor cooling apparatus shown in FIG. 1.
Figure 3:
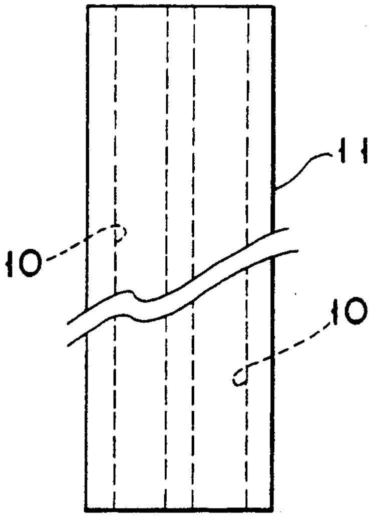
FIG. 3 is a front view showing an elongated member for manufacturing a metal block.
Figure 4:
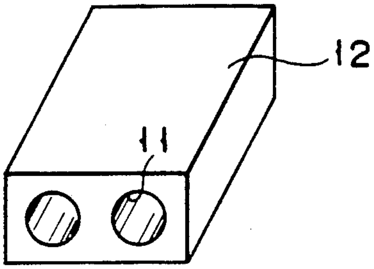
FIG. 4 is a perspective view showing a metal block manufactured from the elongated member shown in FIG. 3.

FIG. 1 is a front view showing a heat pipe semiconductor cooling apparatus manufactured by the method of the present invention, and FIG. 2 is a plan view showing the heat pipe semiconductor cooling apparatus shown in FIG. 1. A method of manufacturing the heat pipe semiconductor cooling apparatus is performed as follows. That is, as shown in FIG. 3, an elongated member 11 which is a cast product or an extruded product consisting of a material having high heat conductivity such as aluminum or copper and having through holes 10 formed in advance is prepared. This extruded product can be easily manufactured by hot extrusion using, e.g., aluminum and its alloy or copper and its alloy. The elongated cast product can be manufactured by a conventional method. This elongated member 11 is cut into a predetermined length to obtain a metal block 12 having through holes 10 each having a predetermined size as shown in FIG. 4.

Subsequently, a plug 13 consisting of the same material as that of the metal block 12 is screwed in or welded to an end portion of each through hole 10, thereby constituting a heat absorbing portion 14 for mounting a semiconductor device.

A pickling treatment or a brushing treatment is performed to remove an oxide film from the through holes 10. One end portion of a heat pipe 15 is inserted in the through hole 10. A low-temperature solder 16 of, e.g., an Sn-Pb-Cd type is buried in a gap from the heat pipe 15 to the through hole 10 and the plug 13 and heated to integrally bond the heat pipe 15 and the metal block 12, thereby improving heat contact properties.

Fins 17 are mounted on the other end portions of the heat pipes 15 by means of press fitting to constitute a radiating portion 18. In this case, the metal block 12 may be placed on a heat-resistant flat plate consisting of a refractory to close the holes without using the plugs 13, and the heat pipes 15 and the metal block 12 may be directly bonded to be integrated by the low-temperature solder 16.

Figure 5A:
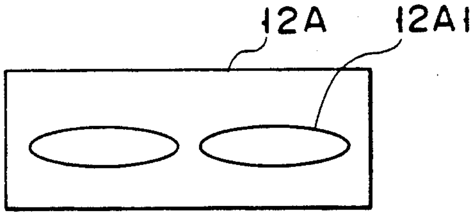
FIG. 5A is a bottom view showing a metal block having through holes each having a substantially elliptical sectional shape.
Figure 5B:
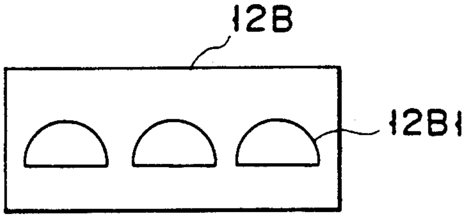
FIG. 5B is a bottom view showing a metal block having through holes having a substantially semicircular sectional shape.
Figure 5C:
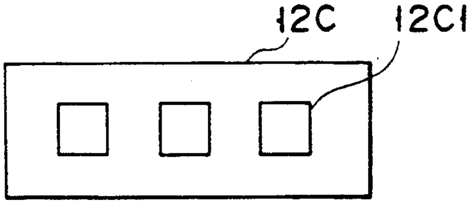
FIG. 5C is a bottom view showing a metal block having rectangular through holes.
Figure 5D:
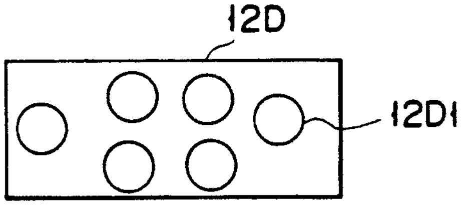
FIG. 5D is a bottom view showing a plurality of through holes each having a substantially circular sectional shape.
Figure 5E:
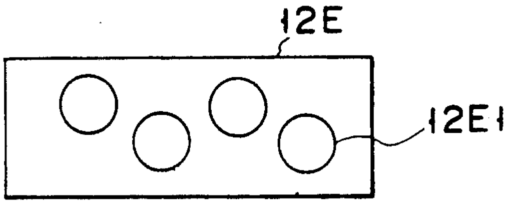
FIG. 5E is a bottom view showing through holes arranged in a zig-zag manner and each having a substantially circular sectional shape.

As shown in FIG. 5A, the metal block may be a metal block 12A having through holes 12A1 each having a substantially elliptical sectional shape so that a heat contact area of the heat-absorbing portion corresponding to the heat pipes 15 is increased. As shown in FIG. 5B, the metal block may be a metal block 12B having through holes 12B1 each having a substantially semicircular sectional shape so that a heat contact area of the heat-absorbing portion corresponding to one side of the heat pipes 15 is increased. As shown in FIG. 5C, the metal block may be a metal block 12C having rectangular through holes 12C1 so that substantially uniform heat-absorbing surfaces are formed on the surfaces of the metal block 12C. As shown in FIG. 5D, the metal block may be a metal block 12D having a large number of through holes 12D1 each having a substantially circular sectional shape so that a heat contact area of the heat-absorbing portion 14 is increased. As shown in FIG. 5E, the metal block may be a metal block 12E in which through holes 12E1 each having a substantially circular sectional shape are arranged in a zig-zag manner so that a heat contact area corresponding to an object to be cooled is obtained.

A heat pipe semiconductor cooling apparatus 20 having the above arrangement is used as, e.g., a thyristor cooling apparatus as follows. That is, a flat power semiconductor device such as a thyristor is mounted on one surface of the metal block 12. Heat generated during an operation of the thyristor is absorbed from the metal block 12 of the heat-absorbing portion 14 to one end portion of each heat pipe 15. This heat evaporates an operating fluid in the heat pipe 15 and is conducted to the radiating portion 18 at the other end of the heat pipe 15. The heat is externally radiated by natural or forcible cooling by the fins 17 of the radiating portion 18.

In the method of manufacturing the heat pipe semiconductor cooling apparatus as described above, boring processing of the metal block 12 is not performed for each through hole 10 but performed by cutting the elongated member 11 into a predetermined length. Therefore, the boring processing which is essential in conventional methods can be omitted. In addition, since the shapes of the metal block 12 and all the through holes 10 can be determined by one cutting processing, shape precision of the heat-absorbing portion 14 can be increased. As a result, a pre-treatment for the through holes 10 can be easily performed, and the quality of the heat-absorbing portion 14 can be improved to improve the performance of the cooling apparatus. Furthermore, since the conventionally essential boring processing can be omitted to facilitate the manufacture of the heat pipe semiconductor cooling apparatus 20, manufacturing cost can be reduced.

Note that a normal operating fluid such as water, fron, or fluorocarbon can be used as the operating fluid of the heat pipe 15.

Figure 6:
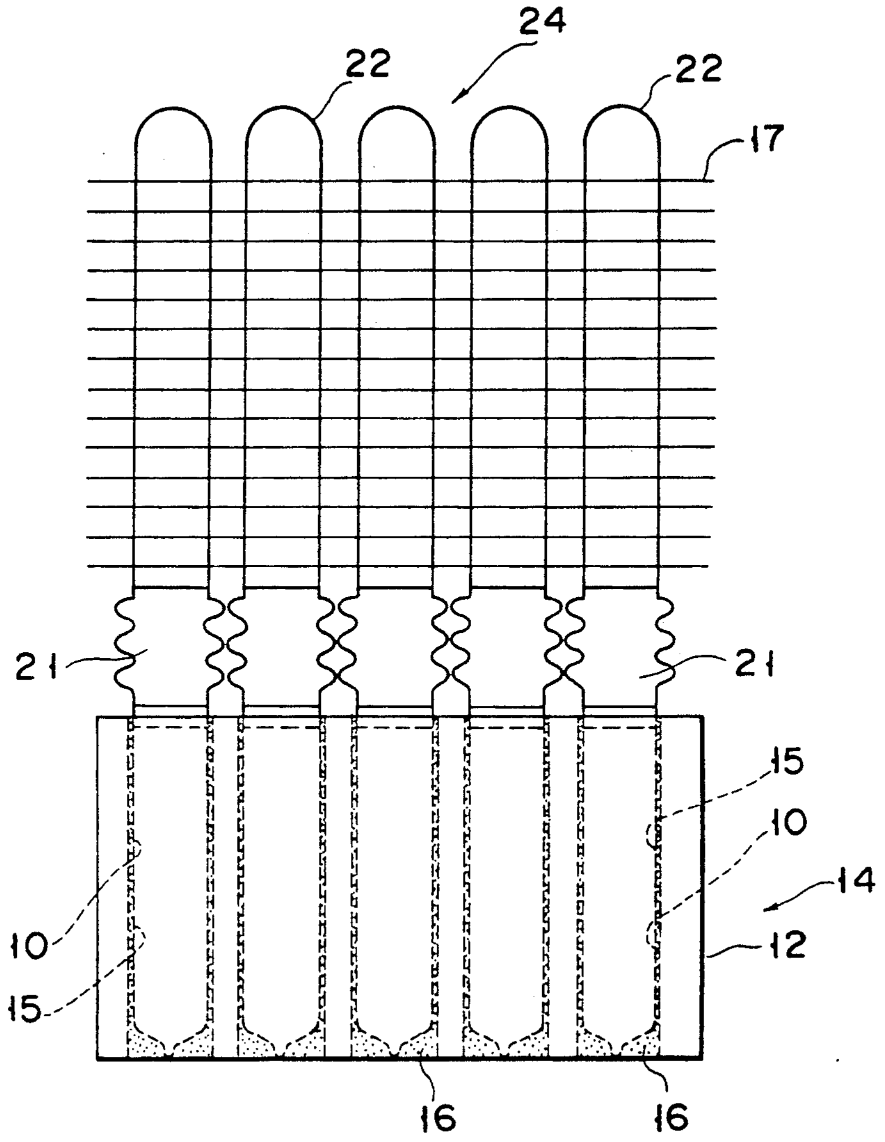
FIG. 6 is a plan view showing an insulating heat pipe semiconductor cooling apparatus manufactured by a method of the present invention.
Figure 7:
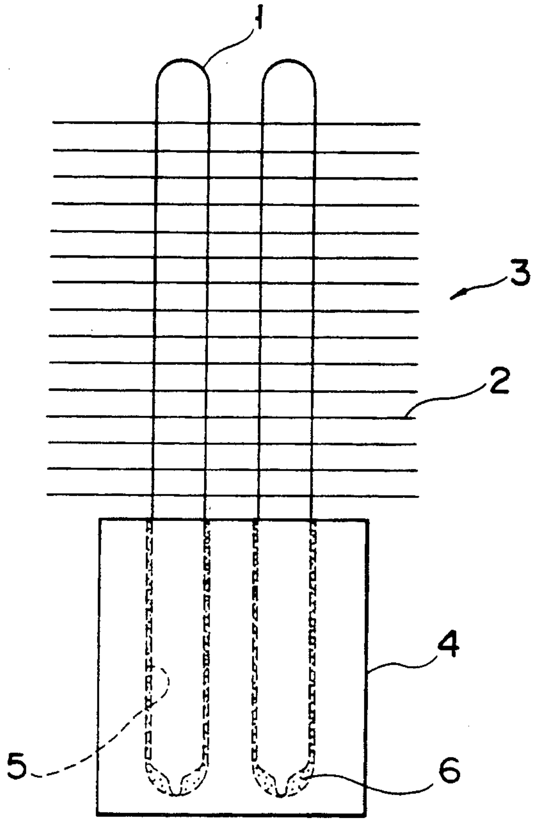
FIG. 7 is a front view showing a heat pipe semiconductor cooling apparatus manufactured by a conventional method.
Figure 8:
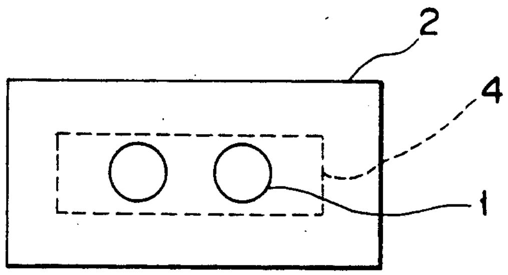
FIG. 8 is a plan view showing the heat pipe semiconductor cooling apparatus shown in FIG. 7.

In addition, as shown in FIG. 6, an electrically insulating cylinder 21 consisting of aluminum may be arranged in an intermediate portion of the heat pipe 15 to obtain an electrically insulating heat pipe semiconductor cooling apparatus 24.

Experiments conducted to confirm the effects of the present invention will be described below.

Experiment 1

An 80-mm wide, 25-mm thick, and 3,000-mm long aluminum extruded elongated member 11 having two through holes 10 each having an inner diameter of 13 mm as shown in FIG. 3 was cut into a length of 100 mm to obtain a metal block 12 of a cooling apparatus as shown in FIG. 4. After the inner surface of each through hole 10 was washed by pickling, an aluminum plug 13 was screwed in an end portion of the hole 10. One end portion of a copper/water-based heat pipe 15 having an outer diameter of 12.7 mm was inserted in each through hole 10. An Sn-Pb-Cd-based low-temperature solder 16 was filled in a gap portion from the heat pipe 15 to the through hole 10 and the plug 13 and heated to integrally bond the heat pipe 15 and the metal block 12. Thereafter, a plurality of aluminum fins 17 were mounted on the other end portions of the heat pipes 15 by press fitting to constitute a radiating portion 18.

Since the heat pipe semiconductor cooling apparatus 20 is manufactured as described above, no boring processing is required. Therefore, the number of manufacturing steps can be reduced by about 20% as compared with a conventional method in which boring processing is performed for each hole in the manufacture of a metal block. In addition, a bonded portion of the obtained heat pipe semiconductor cooling apparatus 20 was perfect, and its shape precision was very high.

Experiment 2

A 100-mm wide, 30-mm thick, and 5,000-mm long aluminum extruded elongated member 11 having five through holes 10 each having an inner diameter of 23 mm was cut into 50 100-mm long metal blocks 12. A brushing treatment was performed for the through holes 10. Subsequently, as shown in FIG. 6, one end portion of an electrically insulating heat pipe 22 consisting of a copper pipe having an outer diameter of 22.23 mm and having an alumina glass cylinder 21 at its intermediate portion was inserted in each through hole 10 of the metal block 12. A low-temperature solder 16 was filled in a gap between the heat pipe 22 and the through hole 10, and the metal block 12 was placed on a refractory plate to close the through hole 10. The metal block 12 was heated to bond the heat pipe 22 and the metal block 12, thereby constituting a heat-absorbing portion 14. A large number of metal fins 17 were mounted on the other end portions of the heat pipes 22 (containing fluorocarbon as an operating fluid) by press fitting to constitute a radiating portion 18.

The insulating heat pipe semiconductor cooling apparatus 24 manufactured as described above was perfectly sechu bonded and had very high shape precision. In addition, in the embodiment, it was confirmed that since the number of the through holes 10 formed in the metal block 12 was five, the number of manufacturing steps was reduced by about 35% to 40% with respect to the conventional manufacturing method.

Industrial Applicability

In a method of manufacturing a heat pipe semiconductor cooling apparatus according to the present invention, a metal elongated member having one or a plurality of through holes is cut into a predetermined length to obtain a metal block having through holes each having a predetermined shape. A heat pipe semiconductor cooling apparatus is manufactured by using these through holes of the metal block. Therefore, since a step of forming through holes by drill processing or the like to be performed after the metal block is formed need not be performed, the number of manufacturing steps can be reduced to improve productivity and reduce manufacturing cost. In addition, the quality of a bonded portion of a heat-absorbing portion can be stabilized, and its shape precision can be increased to significantly improve cooling performance. Furthermore, since a heat pipe having another sectional shape such as an ellipse can be effectively used in the heat-absorbing portion, the present invention is very useful in the field of semiconductor cooling apparatus.

I claim:

1. A method of manufacturing a heat pipe semiconductor cooling apparatus, comprising the steps of:

forming at least one through hole in a metal elongated member, each said at least one through hole having first and second open ends;

cutting said metal elongated member to have a predetermined length to obtain a metal block;

providing at least one heat pipe, each said at least one heat pipe having a first and a second end portion;

placing said metal block on a refractory flat plate to seal the first open end of said at least one through hole;

inserting a low temperature solder and the first end portion of a respective at least one heat pipe in each of the at least one through holes;

bonding said first end portion of the at least one heat pipe to the metal block by heating and melting the low temperature solder, thereby forming a heat-absorbing portion; and mounting fins on the second end portion of said at least one heat pipe to form a radiating portion.

2. A method according to claim 1, further comprising mounting at least one heat generating electrical component on said metal block.

3. A method according to claim 1, wherein the fins are mounted on said at least one heat pipe by press fitting said fins on the second end portion of each of said at least one heat pipes.

4. A method according to claim 2. further comprising:

mounting a heat generating electrical component on said metal block; and mounting an electrically insulating cylinder in an intermediate portion of each of said at least one heat pipe to electrically insulate each of said at least one heat pipe from the electrical component mounted on said metal block.

5. A method according to claim 4, wherein said electrically insulating cylinder is formed of alumina.

6. A method of manufacturing a heat pipe semiconductor cooling apparatus, comprising the steps of:

forming at least one through hole in a metal elongated member, each at least one through hole having first and second open ends;

cutting said metal elongated member to have a predetermined length to obtain a metal block having a predetermined shape;

sealing the first open end of the at least one through hole;

providing at least one heat pipe, each of said at least one heat pipes having a first and a second end portion;

inserting a low temperature solder and the first end portion of a the at least one heat pipe in the at least one through hole, bonding the first end portion of the at least one heat pipe to the metal block by heating and melting the low temperature solder, thereby forming a heat-absorbing portion; and mounting fins on the second end portion of the at least one heat pipe to form a radiating portion on said at least one heat pipe.

7. A method according to claim 6, wherein the cross-sectional shape of said at least one through hole is substantially an ellipse.

8. A method according to claim 6, wherein the cross-sectional shape of said at least one through hole is substantially a semi-circle.

9. A method according to claim 6, wherein the cross-sectional shape of said at least one through hole is

10. A method according to claim 6, wherein the cross-sectional shape of said at least one through hole is substantially circular.

11. A method according to claim 6, wherein oxide film formed by oxidation on an inner surface of the at least one through hole after said through hole is formed is removed by a pickling treatment.

12. A method according to claim 6, wherein oxide film formed by oxidation on an inner surface of the at least one through hole after said through hole is formed is removed by a brushing treatment.

13. A method according to claim 6, wherein said metal elongated member is formed of aluminum.

14. A method according to claim 6, wherein said metal elongated member is formed of copper.

15. A method according to claim 6, wherein said metal elongated member is formed by a casting process.

16. A method according to claim 6, wherein said elongated member is formed by an extrusion process.

17. A method according to claim 6, wherein the step of sealing each of the at least first end portions of each through hole comprises fitting a plug in said first open end of each of said at least one through hole.

18. A method according to claim 6, wherein the step of sealing each of the at least first end portions of each through hole comprises welding a plug in the first open end of each of said at least one through hole.

19. A method according to claim 6, wherein an operating fluid is sealed in each of said at least one heat pipe, said operating fluid being water or a fluorocarbon.

20. A method according to claim 6, wherein the fins are mounted on said at least one heat pipe by press fitting said fins on the second end portion of each of said at least one heat pipe.

21. A method according to claim 20, further comprising the step of mounting at least one heat generating electrical component on said metal block.

* * * * *